(12) United States Patent
Hu et al.

(10) Patent No.: US 8,314,727 B2
(45) Date of Patent: Nov. 20, 2012

(54) CONVERTER

(75) Inventors: Jingjing Hu, Eindhoven (NL); Lucien Johannes Breems, Eindhoven (NL)

(73) Assignee: NXP B.V., Eindhoven (NL)

( * ) Notice: Subject to any disclaimer, the term of this patent is extended or adjusted under 35 U.S.C. 154(b) by 11 days.

(21) Appl. No.: 12/977,820

(22) Filed: Dec. 23, 2010

(65) Prior Publication Data

US 2011/0148678 A1 Jun. 23, 2011

(30) Foreign Application Priority Data

Dec. 23, 2009 (EP) .................................. 09252902

(51) Int. Cl.
*H03M 3/00* (2006.01)
(52) U.S. Cl. ........................ 341/143; 341/126
(58) Field of Classification Search .................. 341/143, 341/144, 126, 139, 150, 118
See application file for complete search history.

(56) References Cited

U.S. PATENT DOCUMENTS

| 6,266,002 B1 | 7/2001 | Gong et al. |
| 6,384,761 B1 | 5/2002 | Melanson |
| 6,909,754 B2 | 6/2005 | Breems et al. |
| 7,808,409 B2 * | 10/2010 | Kim ............... 341/126 |

OTHER PUBLICATIONS

Extended European Search Report for European Patent Appln. No. 09252902.3 (Jun. 9, 2010).
R.T. Baird, T.S. Fiez, "Linearity enhancement of multibit ΔΣ A/D and D/A convertors using data weighted averaging," IEEE transactions on circuit and systems II, pp. 753-762, Dec. 1995.

O. Nys, R.K. Henderson, "Dynamic element matching techniques with arbitrary noise shaping function," International symposium on circuit and system, pp. 293-296, May 1996.

* cited by examiner

*Primary Examiner* — Joseph Lauture

(57) ABSTRACT

A method of providing a value for each element of a sequence of elements in a converter, the values being for a present conversion cycle in operation of the converter, wherein a pointer position identifies an element in the sequence of elements for a conversion cycle. The method comprising:
calculating a pointer position for the present conversion cycle ($P_{i+1}$) in accordance with an $N^{th}$ order noise shaped function based on pointer positions for N previous conversion cycles ($P_i$ to $P_{i-(N-1)}$);
determining if the pointer position for the present conversion cycle ($P_{i+1}$) is in excess of the number of elements in the sequence;
attributing a first component-value to all of the elements, comprising:
attributing a first component-value of +1 if the pointer position for the present conversion cycle ($P_{i+1}$) is in excess of the number of elements in the sequence; and
attributing a first component-value of −1 if the pointer position for the present conversion cycle ($P_{i+1}$) is not in excess of the number of elements in the sequence;
updating the new pointer position ($P_{i+1}$) by performing a modulo operation and replacing the new pointer position ($P_{i+1}$) with the remainder value;
attributing a second component-value to the elements in accordance with a $(N-1)^{th}$ order algorithm;
attributing a third component-value to the elements in accordance with the inverse of the second component-value for the previous conversion cycle; and
adding the first, second and third component-values for each element in order to provide a value for each of the elements for the present conversion cycle.

17 Claims, 14 Drawing Sheets

CONVERTER

CROSS-REFERENCE TO RELATED APPLICATIONS

This application claims the priority under 35 U.S.C. §119 of European patent application no. 09252902.3, filed on Dec. 23, 2009, the contents of which are incorporated by reference herein.

The present disclosure relates to the field of converters, and particularly, although not exclusively, a method of attributing values to a sequence of DAC elements of a multi-bit data converter in successive conversion cycles.

Delta sigma analogue-to-digital converters (ADC's) and digital-to-analogue converters (DAC's), collectively referred as Delta sigma data converters, are widely used in high-precision, low bandwidth applications.

Multi-bit DAC's and ADC's have advantages over single bit designs, including a better selection of noise shaping functions, although a drawback of multi-bit converters is a requirement for matching between elements in order to achieve linearity and low noise.

U.S. Pat. No. 6,384,761 (Melanson) discloses a multi-bit data converter.

U.S. Pat. No. 6,266,002 (Gong et al) discloses a second order noise shaping dynamic element matching for multi-bit data converters.

The listing or discussion of a prior-published document or any background in the specification should not necessarily be taken as an acknowledgment that the document or background is part of the state of the art or is common general knowledge.

According to a first aspect of the invention, there is provided a method of providing a value for each element of a sequence of elements in a converter, the values being for a present conversion cycle in operation of the converter, wherein a pointer position identifies an element in the sequence of elements for a conversion cycle, the method comprising:
  calculating a pointer position for the present conversion cycle ($P_{i+1}$) in accordance with an $N^{th}$ order noise shaped function based on pointer positions for N previous conversion cycles ($P_i$ to $P_{i-(N-1)}$);
  determining if the pointer position for the present conversion cycle ($P_{i+1}$) is in excess of the number of elements in the sequence;
  attributing a first component-value to all of the elements, comprising:
    attributing a first component-value of +1 if the pointer position for the present conversion cycle ($P_{i+1}$) is in excess of the number of elements in the sequence; and
    attributing a first component-value of −1 if the pointer position for the present conversion cycle ($P_{i+1}$) is not in excess of the number of elements in the sequence;
  updating the new pointer position ($P_{i+1}$) by performing a modulo operation and replacing the new pointer position ($P_{i+1}$) with the remainder value;
  attributing a second component-value to the elements in accordance with a $(N-1)^{th}$ order algorithm;
  attributing a third component-value to the elements in accordance with the inverse of the second component-value for the previous conversion cycle; and
  adding the first, second and third component-values for each element in order to provide a value for each of the elements for the present conversion cycle.

An advantage associated with this method is that higher order dynamic element matching (DEM) algorithms can be implemented with a reduction in the amount of processing that is required, when compared with the prior art. This can enable a large quantizer to be used and therefore improve the noise performance of the converter. In turn, this can enable a large bandwidth of data to be processed by the method that was previously not possible. Such a method can enable a whole bandwidth of signals (for example with a bandwidth of the order of 20 MHz to 27 MHz) received by a car radio to be satisfactorily processed.

An advantage associated with attributing a third component-value to elements associated with a new pointer position that is the inverse of the second component-value for the present pointer position is that all elements are selected with an opposite sign once every two clock cycles, and this can reduce the effects of any mismatches as variations can be considered as cancelling/averaging out over time.

The method can enable more sophisticated noise functions to be implemented (such as $2^{nd}$ or higher order functions for high bandwidth systems) that were not previously possible for very high sampling frequencies.

The $N^{th}$ order noise shaped function can be a first order function, and:
  calculating the pointer position can comprise adding an index to the previous pointer position; and
  attributing the second component-value to the elements can comprise:
    attributing a value of −1 for all elements at a position less than, or equal to, the new pointer position; and
    attributing a value of +1 for all elements at a position greater than the pointer position.

The $N^{th}$ order noise shaped function may be a second order function, and:
  calculating the new pointer position ($P_{i+1}$) can comprise multiplying the present pointer position ($P_i$) by two, adding an index and subtracting the previous pointer position ($P_{i-1}$); and
  attributing the second component-value to the elements can comprise:
    attributing a value of +1 for all elements at a position between the present pointer position ($P_i$) and the new pointer position ($P_{i+1}$), and attributing a value of −1 for all other elements.

Attributing the third component-value to the elements can comprise:
  attributing a value of −1 for all elements at a position between the previous pointer position ($P_{i-1}$) and the present pointer position ($P_i$), and attributing a value of +1 for all other elements.

In addition, as an initial sub-step for any second (or higher) order noise shaped function, any overflow that may have occurred between two previous conversion cycles (such as $P_i$ and $P_{i-1}$) should be removed so that the pointer position for the previous conversion cycles are recovered to their original values before a modulo operation was performed during the processing for the previous conversion cycles.

The method may further comprise, prior to calculating the pointer position for the present conversion cycle:
  updating the N previous pointer positions to remove any overflow between successive pointer positions.

Removing the overflow of the previous two pointer $P_i$ and $P_{i-1}$ should be performed before calculating the new pointer $P_{i+1}$, and the newer pointer position should be larger than the older pointer. For example, $P_2 > P_1$, $P_3 > P_2$, and so on.

Determining if the pointer position for the present conversion cycle ($P_{i+1}$) is in excess of the number of elements in the sequence may comprise:

determining if the difference between the pointer position for the present conversion cycle ($P_{i+1}$) and the pointer position for the previous conversion cycle ($P_i$) is in excess of the number of elements in the sequence The method may further comprise, after attributing the first component-values:

performing a modulo operation on the N previous pointer positions and replacing the N previous pointer positions with the remainder value.

Determining if the pointer position for the present conversion cycle ($P_{i+1}$) is in excess of the number of elements in the sequence can comprise identifying whether or not the pointer position will rollover/wrap around the sequence of elements.

The method may be a method of dynamic element matching/digital weight averaging.

The elements may be digital-to-analogue (DAC) elements/units. The elements may be configured to provide one of a plurality of discrete values therefrom.

The converter may be a DAC or an ADC. The method can be used for DAC elements as well as ADC (quantizer) elements. For example, such a quantizer can have a resistor ladder to provide fifteen different reference levels, which can also introduce a mismatch due to mismatches between the fifteen individual resistors.

The converter may be part of a sigma delta converter. The DAC may be part of a feedback loop of a sigma delta converter.

The step of adding the first, second and third component-values for each element may result in a plurality of different values, and the method may further comprise:

providing the value for each of the elements for the present conversion cycle by providing a temporal sequence of sub-values to an element for the conversion cycle, wherein the sequence of sub-values is symmetrical.

It has been found that using a symmetrical sequence of sub-values can reduce any non-linearities in the performance of the converter.

There may be provided a converter configured to implement any method disclosed herein. The converter may be a multi-bit data converter.

The converter may be a switched-capacitor digital to analogue converter (SC-DAC). This can be considered as an advantageous implementation of embodiments of the invention as it can process signal quickly due to the fact that the SC-DAC does not have to completely settle in order to function correctly.

There may be provided a sigma-delta converter comprising:

a digital implementation of any digital to analogue converter disclosed herein in the feedback loop of the sigma-delta converter; and/or an analogue implementation of any digital to analogue converter disclosed herein in the feedback loop of the sigma-delta converter.

There may be provided a sigma-delta converter comprising:

one or more components configured to perform any method disclosed herein in the digital domain; and/or one or more components configured to perform any method disclosed herein in the analogue domain.

There may be provided an integrated circuit comprising any converter disclosed herein.

There may be provided a computer program, which when run on a computer, causes the computer to configure any apparatus, including a converter, circuit, system, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

A description is now given, by way of example only, with reference to the accompanying drawings, in which.

One or more embodiments disclosed herein can provide an algorithm that can be implemented in the analogue or digital domain that enables a high order noise function to be conveniently implemented in the DAC of a feedback loop of a sigma delta converter. Such an algorithm may be considered as a convenient implementation in as much as the required processing may be performed fast enough that it can be used to satisfactorily process large bandwidth signals.

Dynamic element matching (DEM) is a technique which can be applied to oversampled multi-bit digital to analogue converters (DAC) that are known to be used as part of a sigma-delta analogue to digital converter. An example of a prior art sigma-delta analogue to digital converter (ADC) is shown as FIG. 1.

Figure 1:
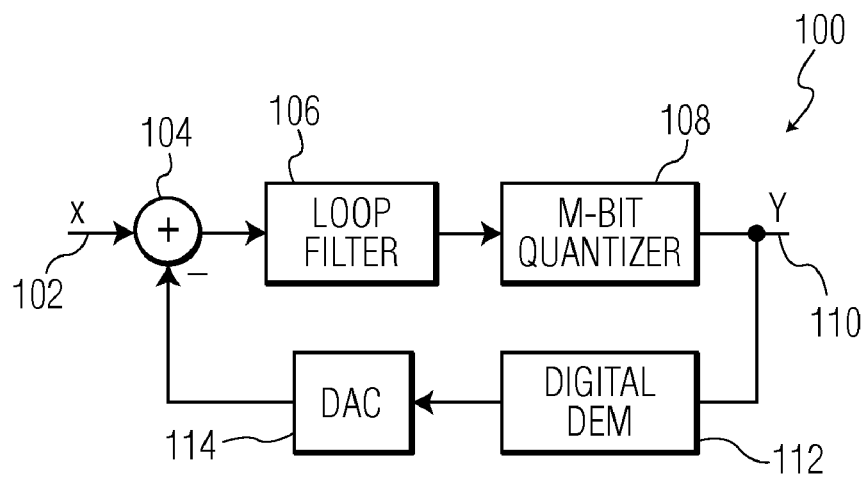
FIG. 1 illustrates a prior art sigma-delta analogue to digital converter (DAC)

The sigma-delta ADC 100 of FIG. 1 receives an analogue signal x 102, which is provided as an input to an adder 104. The output of the adder 104 is provided to a loop filter 106, and the output of the loop filter 106 is provided to a M-bit quantizer 108. The output of the M-bit quantizer 108 is the digital output signal Y 110 of the converter, and is also fed back to a digital DEM component 112. The output of the digital DEM component 112 is provided to a digital to analogue converter (DAC) 114, the output of which is provided as a negative input to the adder 104.

As is known in the prior art, digital element matching (DEM) can improve the mismatch-induced non-linearity of the sigma-delta ADC 100, and this can be achieved by randomising the mismatch errors by applying a noise shape function.

Figure 2:
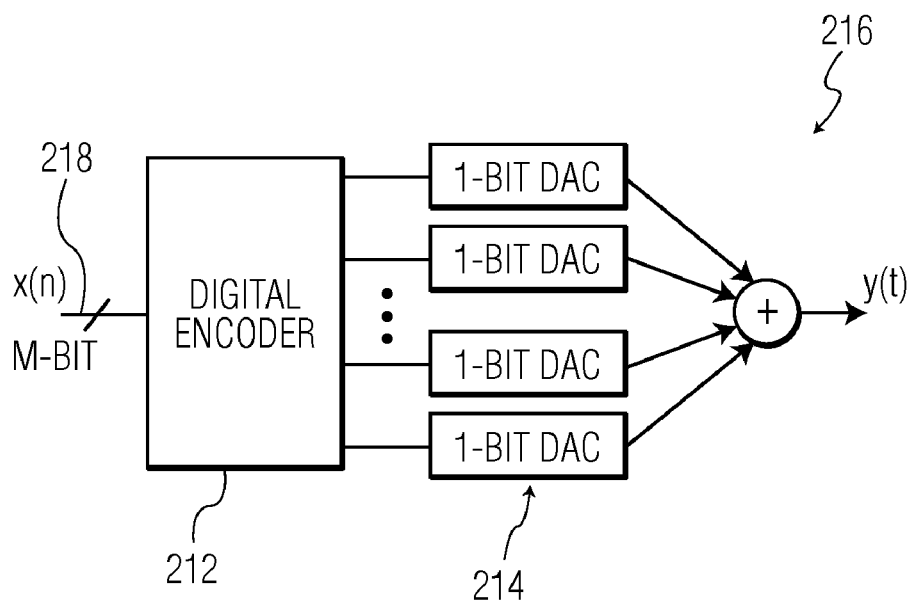
FIG. 2 illustrates further details of a digital DEM component and DAC.

FIG. 2 illustrates further details of the digital DEM component 212 and DAC 214. In this example, the DAC 214 consists of a plurality of one bit DAC's, which can be independently operated such that the summation of the outputs of the one-bit DAC's 214 is provided as signal y(t) 216, which represents the analogue equivalent of the received digital signal 218. Each of the one-bit DAC's 214 may be referred to as an element.

FIG. 3 illustrates schematically values that are attributed to elements for consecutive conversion cycles as generated by a digital encoder.

In the example of FIG. 3, a four bit DAC is illustrated, thereby comprising fifteen independent elements as identified with reference 302 in FIG. 3. FIG. 3 shows the element values for seven consecutive conversion cycles, the index of which is shown with reference 304 in FIG. 3.

Each of the elements can have a value of either +1, which is shown as a solid block 306 in FIG. 3, or a value of −1 as shown with an open block 308 in FIG. 3.

Figure 3B:
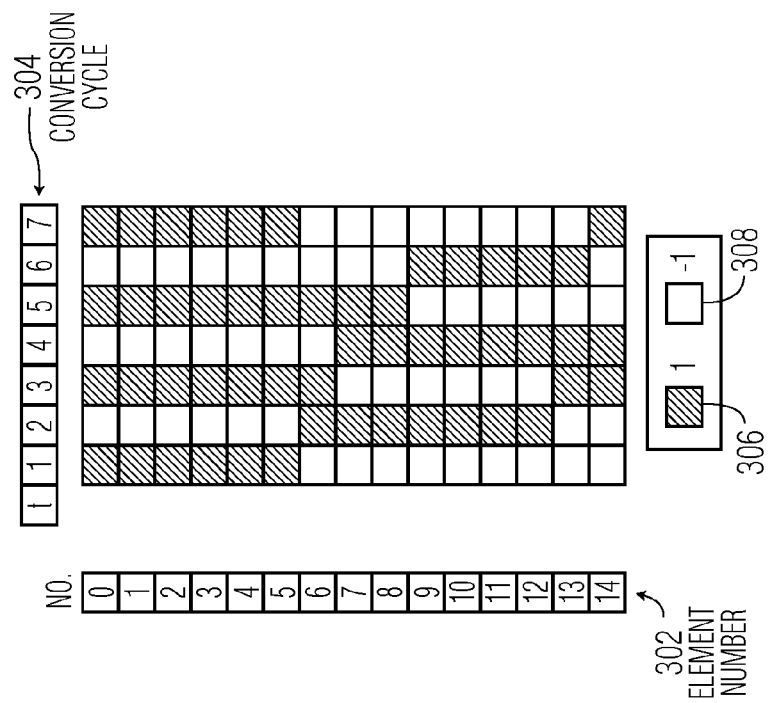
FIG. 3 illustrates schematically values that are attributed to elements for consecutive conversion cycles as generated by a digital encoder.
Figure 3A:
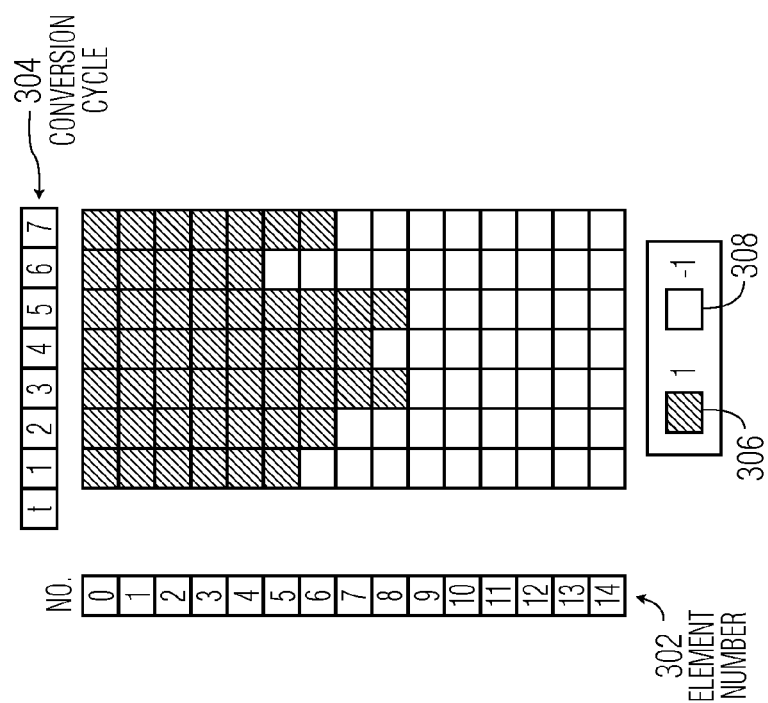

The example of FIG. 3a is illustrative of a four bit DAC without DEM, and FIG. 3b is illustrative of a four bit DAC with first order DEM.

The relationship between the output code value and the number of +1 elements is shown in Table 1.

'Dynamic element matching techniques with arbitrary noise shaping function', by O. Nys and R. K. Henderson, International symposium on circuit and system, pp. 293-296, May. 1996 shows that, in theory, a higher-order noise shaping algorithm can be used to achieve better linearity. However, a noise shaping function higher than first-order is rarely used in practice due to the complexity of the implementation. For example, the increase in complexity can mean that the required processing cannot be performed quickly enough. The mass computation of scrambling a digital code can make known higher order dynamic element matching algorithms impossible to be implemented at a high sampling rate.

Prior art digital methods of implementing a higher order DEM algorithm can require a swap matrix which has a complexity proportional to $2^N$ (N bit quantizer). Such a matrix calculation can cause considerable delay which can influence the stability of the system. Other prior art methods include a sorting algorithm, which can sort a quantizer output with a second order digital sigma delta converter. Both of these examples of the prior art can have a limitation in terms of a calculation time, such that they are not suitable for use in a high speed multi-bit sigma-delta modulator. It can be very difficult, if not impossible, to implement the sorting for a four-bit quantizer above 100 MHz clock frequency.

Figure 5:
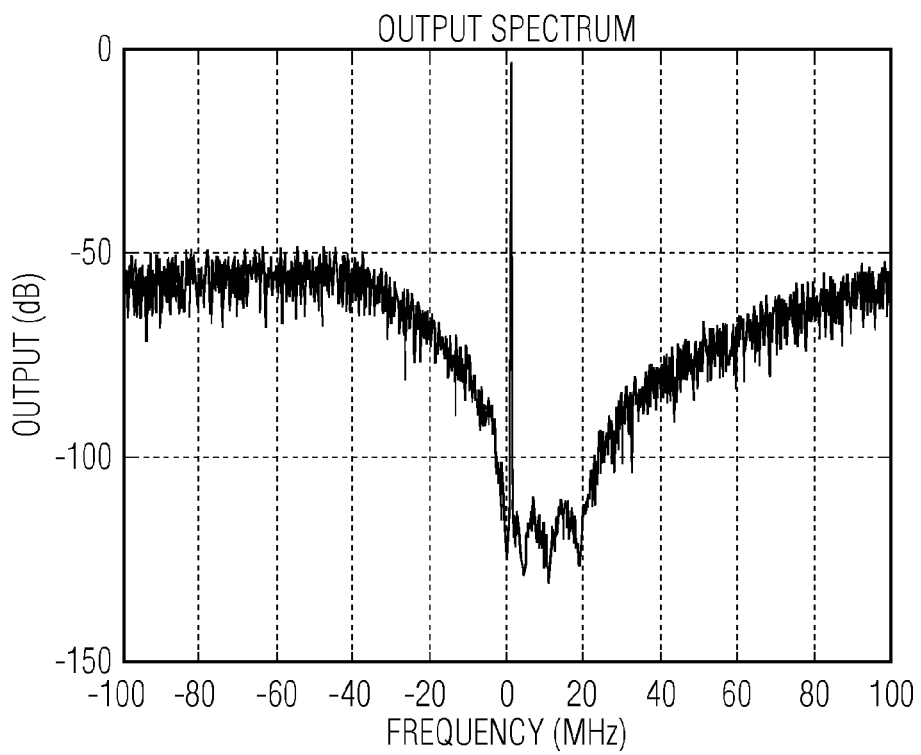
FIG. 5 represents the simulated ideal output spectrum of a modulator.

For the following description, a model of a continuous-time complex fourth order four-bit sigma-delta modulator is used for simulations. The loop filter has four complex notches in the frequency band from 0 to 20 MHz. The sampling frequency is 436.8 MHz. The frequency spectrum shown in FIG. 5 represents the simulated ideal output spectrum of such a modulator, and can be used as a reference frequency spectrum for the embodiments of the invention that follow. The noise is suppressed by four complex resonators at different frequencies in the signal band, and this causes four notches to be seen in the band. Any DAC mismatch induced noise can fill the notches, and therefore increase the noise floor, which can cause degradation in the performance of the sigma-delta modulator.

Figure 4:
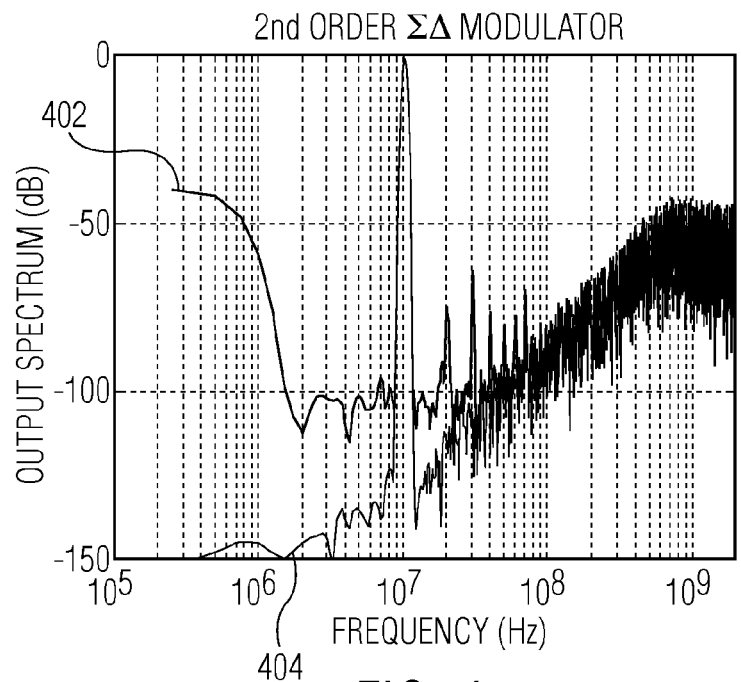
FIG. 4 illustrates two simulated output spectra.

FIG. 4 illustrates two simulated output spectra for a typical second order sigma-delta modulator with a four-bit DAC. The curve shown with reference 402 represents the output spectrum for unit elements of the four-bit DAC with a 1% (one sigma) mismatch. The curve with reference 404 represents

| | Output code | | | | | | | | | | | | | | | |
|---|---|---|---|---|---|---|---|---|---|---|---|---|---|---|---|---|
| | −15 | −13 | −11 | −9 | −7 | −5 | −3 | −1 | 1 | 3 | 5 | 7 | 9 | 11 | 13 | 15 |
| Number of +1 elements | 0 | 1 | 2 | 3 | 4 | 5 | 6 | 7 | 8 | 9 | 10 | 11 | 12 | 13 | 14 | 15 |
| Number of −1 elements | 15 | 14 | 13 | 12 | 11 | 10 | 9 | 8 | 7 | 6 | 5 | 4 | 3 | 2 | 1 | 0 |

For a sequence of DAC feedback output values of −3, −1, 3, 1, 3, −5, −1, for seven consecutive conversion cycles it can be seen from Table 1 that a sequence of 6, 7, 9, 8, 9, 5, 7 elements should be selected with a value "+1" for conversion cycles from t=1 to t=7. The remainder of the elements should be selected with a value of "−1". Such a sequence of selected elements is shown as FIG. 3a.

A first-order dynamic element matching algorithm can be considered as a rotation of the selection of the elements with a "+1" value, such that an element is selected as "+1" for a subsequent conversion cycle starting from the next element to be selected from the previous conversion cycle. Such a first-order DEM algorithm is shown as FIG. 3b.

the same modulator having a four-bit DAC with dynamic element matching. It can be seen from FIG. 4 that the mismatch induced non-linearity of the converter with DEM is now first-order shaped, and the strong non-linear tones have been reduced. As discussed above, the first-order DEM algorithm uses all of the DAC elements at a maximum possible rate, while ensuring that each element is used an equal number of times on average to reduce the mismatch influence and shape the non-linearity. Control algorithms for attributing values to each of the elements in the DAC according to an embodiment of the invention are described below.

Embodiments of the invention can be considered as providing an improved dynamic element matching algorithm (which may be known as a data weighting averaging (DWA) algorithm)).

Figure 6D:
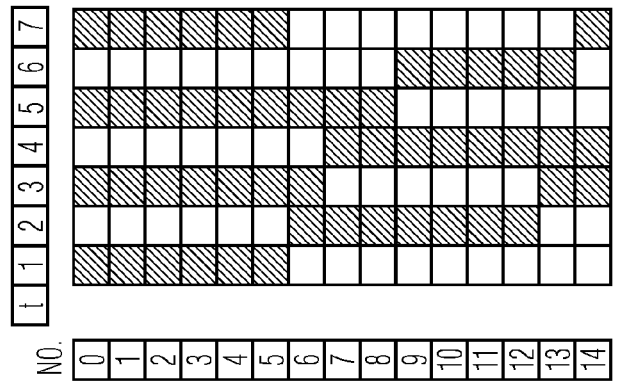
FIG. 6 illustrates schematically a first-order DEM algorithm according to an embodiment of the invention.
Figure 6C:
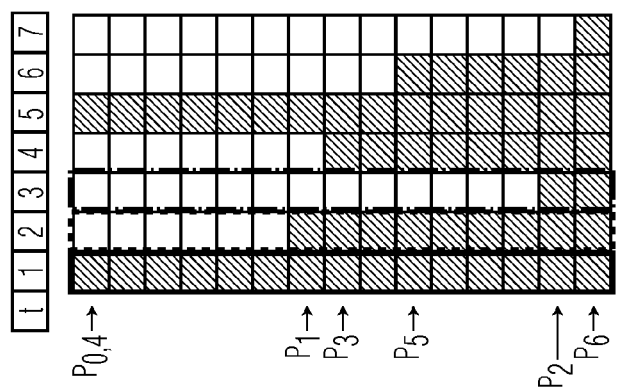
Figure 6B:
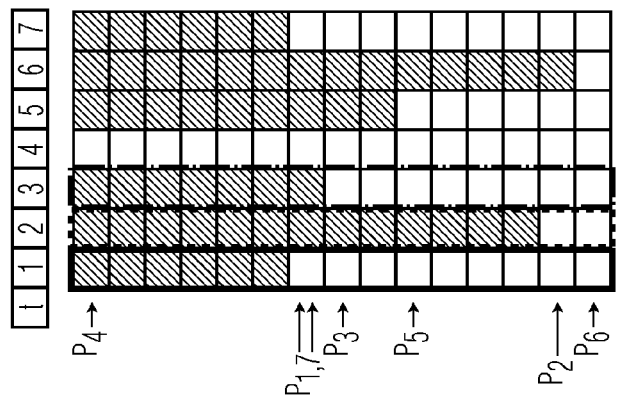
Figure 6A:
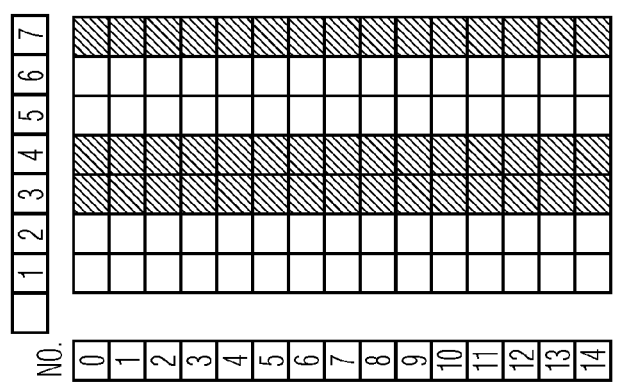

As a first example, a first-order DEM algorithm will be described with reference to FIG. 6. As mentioned above in relation to the first order DEM, a pointer rotation scheme, is used such that the new pointer for a present conversion cycle is the previous pointer value for the previous conversion cycle plus the number of "+1" elements that have been used as part of the previous conversion cycle. For the present conversion cycle, the "+1" element selection can then start from the new pointer position. In case of an overflow, the element selection starts from the first element again. The resultant element selection is shown as FIG. 3 (b), which is the same as the element selection illustrated in FIG. 6 (d) However, the algorithm of the embodiment of the invention can attribute the final elemental values in a new way, as is illustrated in FIGS. 6(a) to (c).

FIGS. 6(a) to (d) will now be discussed in relation to the implementation of the selection of the number of elements illustrated in the following table:

| Previous | Number of selected element index | New |
|---|---|---|
| $P_0 = 0$ | 6 | $P_1 = 6$ |
| $P_1 = 6$ | 7 | $P_2 = 13$ |
| $P_2 = 13$ | 9 | $P_3 = 22(7)$ |
| $P_3 = 7$ | 8 | $P_4 = 15(0)$ |
| $P_4 = 0$ | 9 | $P_5 = 9$ |
| $P_5 = 9$ | 5 | $P_6 = 14$ |
| $P_6 = 14$ | 7 | $P_7 = 21(6)$ |

It can be seen from the above table, that, for successive conversion cycles, the following sequence of DAC elements should be selected: 6, 7, 9, 8, 9, 5, 7.

The algorithm starts at step 1, whereby the new pointer value for the present conversion cycle is calculated. In this first order example, the new pointer value for the present conversion cycle is set as the pointer value for the previous conversion cycle ($P_{i-1}$) plus the number of elements that are to be selected for that conversion cycle ($Index_i$). That is:

$$P_i = P_{i-1} + Index_i$$

The new pointer value for the present conversion cycle is then compared with the total number of elements to determine if an overflow will occur. If it is determined that an overflow will occur, then all of the elements for the present conversion cycle are set as "+1", and if it is determined that an overflow will not occur, then all of the elements are selected as "−1". That is:

If $0 = <P_i < 15$, then all elements are selected as "−1";

If $P_i >= 15$, then all elements are selected as "+1".

This initial selection of values may be considered as attributing first "component-values" for the elements, and is shown in FIG. 6 (a).

As a final stage in the first step of the algorithm, the new pointer value for the present conversion cycle is updated by a modulo operation to get the remainder for the next step in the algorithm. That is, the "overflow" part of the pointer value is removed:

$$P_i = mod(P_i, 15)$$

The first step in the algorithm may be considered as pre-compensation.

As a second step in the algorithm, the elements with a number/index from 0 to the new pointer value ($P_i$) are selected as "+1", and the elements from $P_i$ to 14 are selected as "−1". This may be considered as attributing a second component-value to each of the elements. This is shown as FIG. 6(b).

As a third step in the algorithm, the elements with a number/index from 0 to the pointer position in the previous conversion cycle ($P_{i-1}$) are selected as "−1", and the elements from $P_{i-1}$ to 14 are selected as +1. This can be considered as attributing a third component-value to the elements which is the same as the inverse of the second component-value for the previous conversion cycle. Such a selection of elements is shown as FIG. 6(c).

Finally, as a fourth step in the algorithm, the three component-values for each of the elements that were calculated in the first three steps of the algorithm (as shown in FIGS. 6(a) to (c)) are added together in order to obtain the final values that are to be attributed to/selected for each of the elements for the present conversion cycle. The result of the summation of the first three component values is shown as FIG. 6(d).

As will be described in more detail below, the algorithm that is described with reference to FIG. 6 can provide a more efficient algorithm in terms of processing operations for calculating a DEM/DWA algorithm for attributing values to elements of a converter. The algorithm can also be readily extended to higher order algorithms without significantly increasing the processing requirements.

The DEM/DWA can be understood as time domain compensation. For example, the selection scheme in step 3 has exactly the opposite sequence of values for step 2 of the previous conversion cycle. This means that elements which are selected as +1 in the third step of the algorithm, will be selected as −1 in the second step of the algorithm for the next conversion cycle, and vice versa. That is to say, all of the elements are selected as an opposite value once every two clock cycles. This can lead to any mismatching between the fifteen elements being cancelled, or at least reduced, when averaged over time.

It has been found that an improved implementation of a first-order DEM rotation scheme can be achieved by a combination of the four step algorithm described above.

Figures 7A, 7B, 7C, 7D:
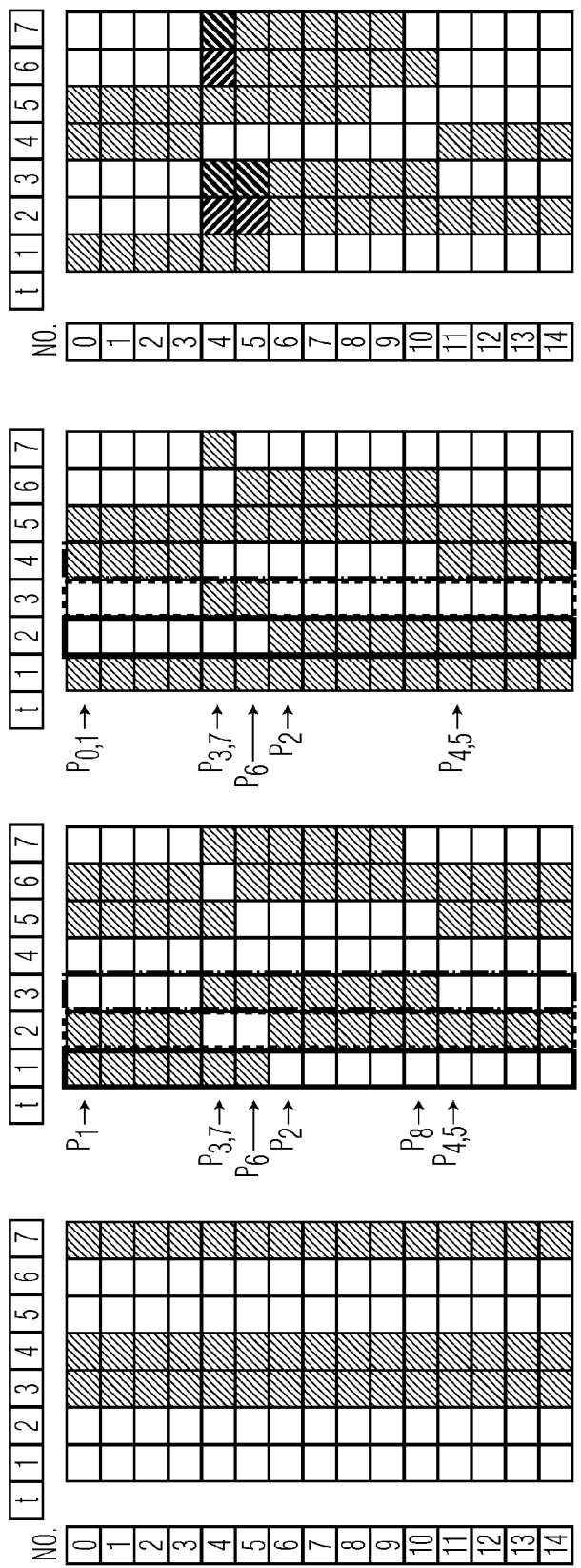
FIG. 7 illustrates schematically a second-order DEM algorithm according to an embodiment of the invention.

FIG. 7 illustrates a second order DEM algorithm, that is similar to the first-order algorithm shown in FIG. 6. The operation of the algorithm described in relation to FIG. 6 is modified due to the increase in the order of the noise shaping function. The main difference being that the pointer position for the present conversion cycle ($P_{i+1}$) for the second order DEM algorithm is calculated with pointer positions from two previous conversion cycles ($P_i$ and $P_{i-1}$).

The algorithm illustrated in FIG. 7 implements the same sequence of required output values for each conversion cycle, and is shown again in the following table, but this time with the pointer positions for the two previous conversion cycles that are required to implement the second order algorithm.

| Previous | Number of selected element index | New |
|---|---|---|
| $P_0 = 0$ $P_1 = 0$ | 6 | $P_1 = 0$ $P_2 = 6$ |
| $P_1 = 0$ $P_2 = 6$ | 7 | $P_2 = 6$ $P_3 = 19(4)$ |
| $P_2 = 6$ $P_3 = 19$ | 9 | $P_3 = 4$ $P_4 = 41(11)$ |
| $P_3 = 4$ $P_4 = 11$ | 8 | $P_4 = 11$ $P_5 = 26(11)$ |
| $P_4 = 11$ $P_5 = 11$ | 9 | $P_5 = 11$ $P_6 = 20(5)$ |
| $P_5 = 11$ $P_6 = 20$ | 5 | $P_6 = 5$ $P_7 = 34(4)$ |
| $P_6 = 5$ $P_7 = 19$ | 7 | $P_7 = 4$ $P_8 = 40(10)$ |

As will be appreciated, a second order algorithm will require selecting one of four discrete values for each of the elements, and in this example the four discrete values are 3, 1, −1 and −3. An element with a value of +3 is shown as a solid block 702 in FIG. 7, an element with a value of +1 is shown as a patterned block 704 in FIG. 7, an element with a value of −1 is shown as an open block 706 in FIG. 7, and an element with a value of −3 is shown as a patterned block 708 in FIG. 7.

As a first step in the algorithm of FIG. 7, the new pointer position for the present conversion cycle ($P_{i+1}$) is calculated according to a second order noise shaping function.

Step one of the algorithm consists of the following sub-steps. As an initial sub-step, any overflow that may have occurred between the two previous conversion cycles ($P_i$ and $P_{i-1}$) should be removed so that the pointer position for the previous conversion cycle ($P_i$) is recovered to its original value before a modulo operation such as the one performed in the algorithm of FIG. 6. That is:

If $P_i < P_{i-1}$, then $P_i = P_i + 15$

The new pointer value for the present conversion cycle is then calculated according to the following second order function in this example:

$$P_{i+1} = 2P_i + \text{Index}_i - P_{i-1}$$

The difference between the pointer value for the present conversion cycle ($P_{i+1}$) and the pointer value for the previous conversion cycle ($P_i$) is then compared with the total number of elements to determine whether or not an overflow will occur between the two conversion cycles, and all of the elements are set accordingly. That is:

If $0 = < P_{i+1} - P_i < 15$, then all elements are selected as "−1";

If $15 = < P_{i+1} - P_i < 30$, all elements are selected as "+1".

The selection of the elements in accordance with the above two formulae can be considered as attributing a first component-value to the elements, and can be known as pre-compensation. The first component-values are shown in FIG. 7(*a*).

After the pre-compensation, the new pointer value for the present conversion cycle ($P_{i+1}$) and the pointer value for the previous conversion cycle ($P_i$) are updated by a modulo operation to get the remainder for the next steps in the algorithm. That is:

$$P_i = \text{mod}(P_i, 15)$$

$$P_{i+1} = \text{mod}(P_{i+1}, 15)$$

A second step in the algorithm is shown as FIG. 7(*b*), and consists of attributing a second component-value to the elements by selecting a value of "+1" for elements between the pointer value of the present conversion cycle ($P_{i+1}$) and the pointer value for the previous conversion cycle ($P_i$) as "+1", and selecting the rest of the elements as "−1". This is shown as FIG. 7(*b*) that is:

elements from $P_i$ to $P_{i+1}$ are selected as +1, the rest of the elements are selected as −1.

A third step of the algorithm is shown as FIG. 7(*c*) and consists of attributing a third component-value to the elements, wherein the third component-value is the inverse of the second step of the algorithm that was performed for the previous conversion cycle ($P_i$). That is, elements with an index from $P_{i-1}$ to $P_i$ are selected as "−1", and the rest of the elements are selected as "+1". The component-value that is attributed to the elements in the third step of the method can be known as the third component-value.

The fourth stage of the method is shown as FIG. 7(*d*) and consists of adding together the first, second and third component-values for the elements that were calculated in steps 1, 2 and 3 and provides the final element values for the present conversion cycle.

In this example, due to the noise shaping function that is used to calculate the pointer value for a present conversion cycle ($P_{i+1}$), the final values that are attributed to the elements can have a final value of "+3", "+1", "−1", or "−3".

In the same way that was illustrated in relation to FIG. 6, time domain compensation is achieved. For example, the selection of component-values at step 3 of the algorithm is exactly opposite to the sequence of values that were selected at step 2 for the previous conversion cycle ($P_{i-1}$). Furthermore, according to the second order scheme, the values that are attributed to the elements at steps 2 and 3 (FIGS. 7(*b*) and (*c*)) have a first order DEM noise shape. The second order is a subtraction of a first order DEM and the delay of itself, and therefore it will be appreciated that a third order, or an even higher $N^{th}$ order scheme can be achieved by subtraction of the immediately lower $(N-1)^{th}$ order DEM scheme.

It will be appreciated that the pointer calculations in relation to overflow will still be required, and that the calculation of the new pointer value for the present conversion cycle ($P_{i+1}$) can be achieved with different noise shape functions.

Figure 8:
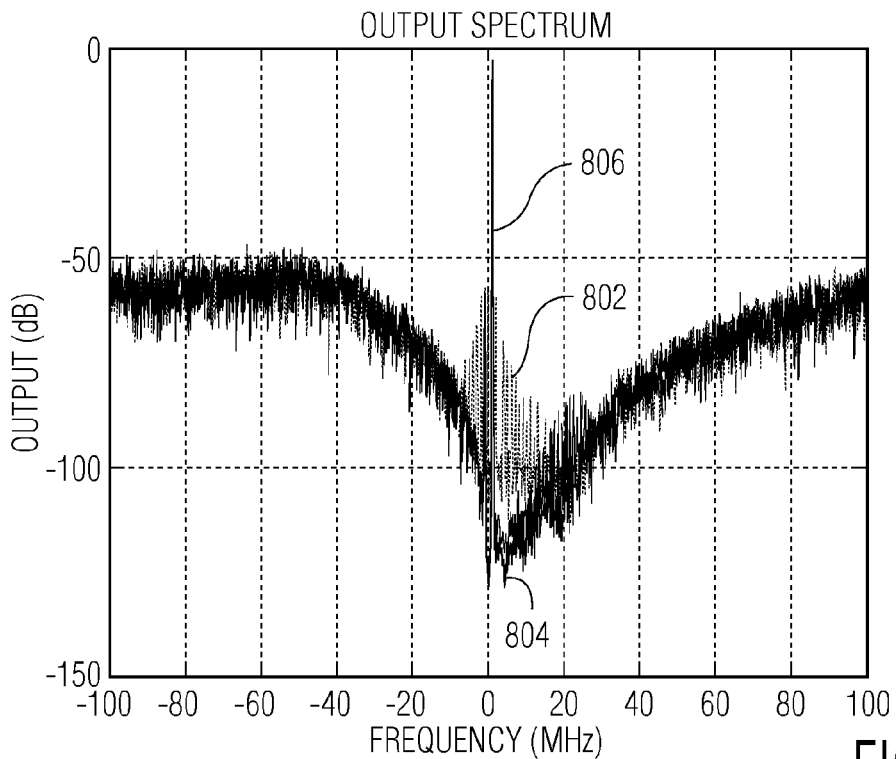
FIG. 8 illustrates graphically a comparison of the output spectrum for the same sigma-delta modulator without DEM, with first order DEM and with second order DEM.

FIG. 8 illustrates graphically the output spectrum for three sigma-delta modulators with a 1% mismatch between the fifteen unit elements. A first curve, with reference 802, shows the output spectrum without DEM. A second curve, with reference 804, shows the output spectrum with first order DEM. A third curve, with reference 806, shows the output spectrum with second order DEM.

By comparing the output spectrum of FIG. 8 with the reference frequency spectrum of FIG. 5, it can be seen that the DAC non-linearity causes in-band noise and distortion tones that deteriorate the effect of the quantization noise suppression of the sigma-delta converter. It can be seen that with the first order DEM algorithm 804, the performance is improved considerably, although the in-band tonal behaviour can be seen to limit the performance. It can be seen that by applying the second order DEM 806, the linearity increases by another factor of ten decibels.

Further to the above two examples of a first order and second order digital DEM algorithm, a more generic form of an $N^{th}$ order digital DEM algorithm can be described as follows.

Step 1

Remove any overflow that may have occurred between N previous pointer positions:

If $P_{i-N} < P_{i-N-1}$, then $P_{i-N} = P_{i-N} + 15$

Calculate a new pointer value for a present conversion cycle with an $N^{th}$ order noise shape function such as $(1-Z^{-1})^N$:

$$\text{Index}_i = P_i(1-Z^{-1})^N$$

Select all of the element values as "−1" if the difference between the new pointer position ($P_{i+1}$) and the previous pointer position ($P_i$) does not exceed the number of elements, that is, there is no rollover/overflow; or select all of the elements as "+1" if the difference between the new pointer value ($P_{i+1}$) and the previous pointer position ($P_i$) for the present conversion cycle is representative of a rollover/overflow. Selecting such values for the elements will be referred to as selecting a first component-value for the elements.

After the pre-compensation, the new pointer value for the present conversion cycle, and any previous pointer positions, is updated by a modulo operation for use in the further steps.

Step 2

Select second component-values for the elements according to an $(N-1)^{th}$ order algorithm.

Step 3

Select third component-values for the elements as the inversed (x−1) and delayed ($xZ^{-1}$) value of step 2.

Step 4

Add the three component-values attributed by steps 1 to 3 in order to provide the final element values.

As shown above, a second order DEM algorithm generates a 4-level output (−3, −1, +1, +3) for each element, which can in turn cause another linearity problem. Therefore, achieving an accurate gain factor of 3 can provide an advantageous implementation of the second order DEM described above. Although it can be possible to implement a gain factor of 3 by using two extra unit elements, the mismatch between these unit elements will not be shaped by the algorithm, and therefore can deteriorate the performance of the converter in the same way as shown with reference 802 in FIG. 8.

Figure 9:
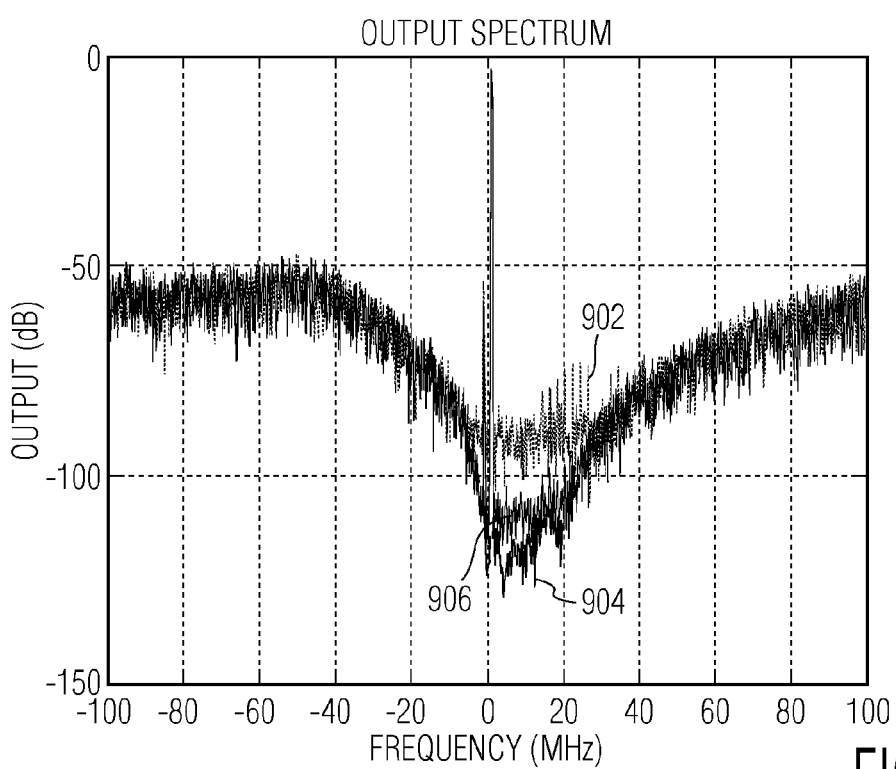
FIG. 9 illustrates graphically a comparison of the performance of a converter with different accuracy level of the output code.

Therefore, the performance of the converter can be undermined by the inaccuracy of the required gain factor of 3, and this is shown in FIG. 9. A first curve with reference 902 shows the output spectrum with a 1% mismatch of the ratio of 3. A second curve, with reference 904, shows the output spectrum with zero mismatch. A third curve, with reference 906, shows the output spectrum for a mismatch of 0.1%. It can be seen that keeping the mismatch ratio smaller than 0.1%, or any other similar value, can more-or-less reserve/maintain the improvement in performance identified above.

An embodiment of the invention can address the problem of mismatch by using a single unit element to generate the multiple, for example four, possible levels of each DAC element. This can provide an accurate ratio with a reduced degree of mismatch when compared with the prior art. That is, one or more problems described above can be addressed by using the same unit element three times within a single sampling period to provide a desired element value.

Such an example requires the DAC to run at a three times faster rate so that the output can be fedback in three steps in a serial manner as described below. For example, a value of "+3" can be achieved by feeding back a "+1", "+1", "+1" sequence. A value "−3" can be fedback as a "−1", "−1", "−1" sequence. A code of "+1" can be implemented by feeding back two "+1" values and one "−1" value. A value of "−1" can be implemented by feeding back two "−1" values and one "+1" value.

Figure 10C:
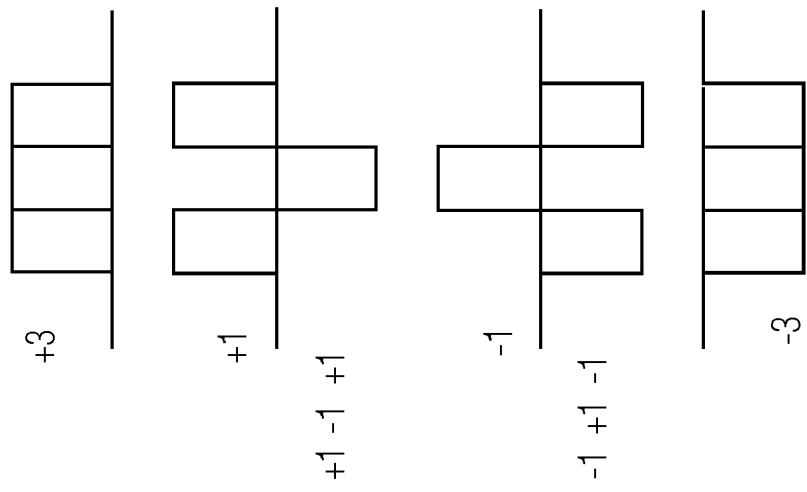
FIGS. 10a to 10c illustrate schematically the selection of a plurality of element values according to an embodiment of the invention.
Figure 10B:
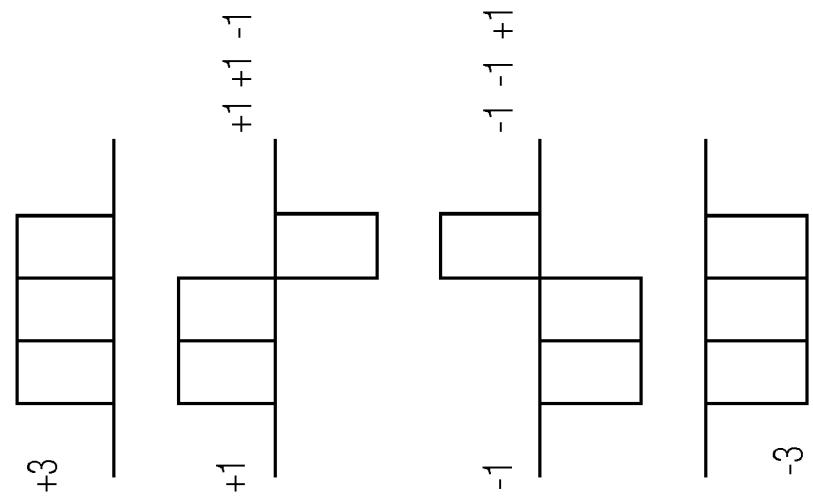
Figure 10A:
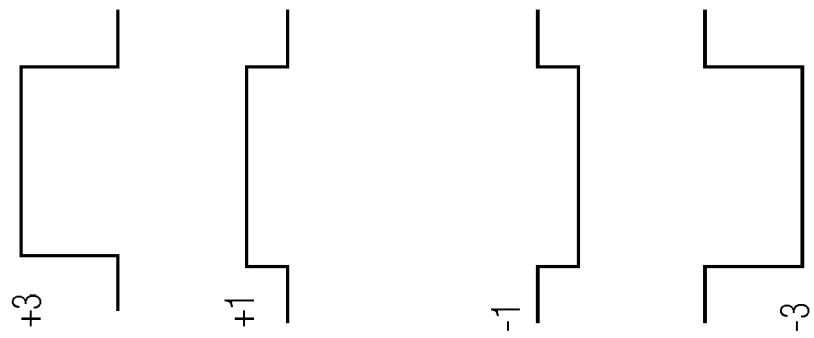

FIG. 10a illustrates an example where three unit elements are used for each element value such that the required elemental value can be achieved by summing the output of the three sub-elements. As described above, such an example can introduce further non-linearities, and therefore degrade the performance of the converter.

FIG. 10b illustrates an example of a converter that uses a single unit element to generate the four possible levels for each DAC element, whereby the required code is a sequence of "+1" and "−1" values as described above. However, it has been identified that a non-symmetrical sequence of codes such as that illustrated in FIG. 10b can cause the delay of the DAC feedback to be dependent on the output code. This can increase the total quantization noise level in the system, which in turn degrades the performance of the converter.

Figure 11:
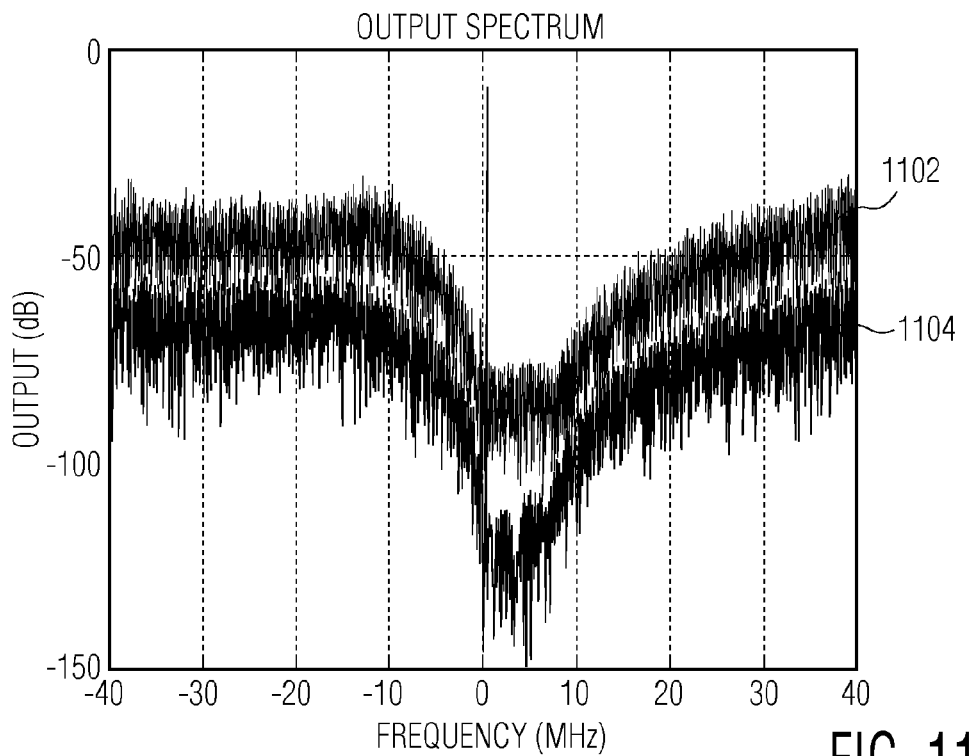
FIG. 11 illustrates graphically a comparison between performance of converters.

FIG. 11 illustrates graphically a comparison between the performance of a converter with non-symmetrical serial codes 1102, which can be seen to be inferior to the performance of the original second order DEM, which is shown with reference 1104 in FIG. 11. The two output spectra that are illustrated in FIG. 11 were simulated with a maximum input signal level of 0.6 volts.

It has been found that an improvement in the performance of the serial DAC can be achieved by feeding back a symmetrical sequence of codes/sub-values, as illustrated in FIG. 10c. As can be seen from FIG. 10c, an output value of "+1" is provided by a feedback sequence of "+1", "−1", "+1" values, and an output value of "−1" is achieved by a feedback sequence of "−1", "+1", "−1" values.

It will be appreciated that this principle can be extended to higher order functions in order to generate 8, 16, or any other higher number, of different output values for a DAC element, and that the number of different output values will depend upon the order of the noise function that is being used.

Figure 12:
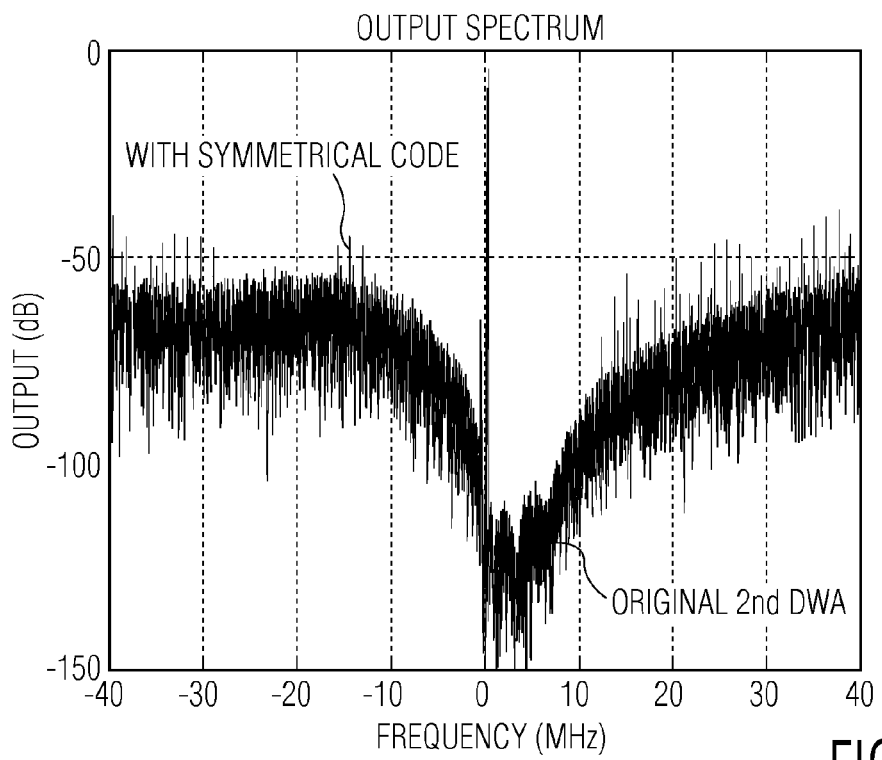
FIG. 12 illustrates the output spectra of converters.

FIG. 12 illustrates the output spectrum for the original second order DEM converter, along with the output spectrum for an implementation of a second order DEM converter that utilises symmetrical codes as described above in relation to FIG. 10c. The output spectra of the two converters that are shown in FIG. 12 are almost indistinguishable, and this can be seen to represent a significant improvement in performance compared with the serial DAC that is illustrated in FIG. 11. No, or very little, visible noise degradation can be observed from FIG. 12 compared to the original ideal second order converter thereby showing an improvement in performance that can be achieved by using symmetrical code sequences.

As described above, an oversampled serial DAC can be used to implement multiple output levels. This method can be particularly suitable for low sampling frequency systems with high linearity requirements, as the oversampling of the original low sampling frequency signal that is required to be able to serially generate the multi output levels can be achievable. However, a speed limitation of the serial DAC can determine the order of the noise shape function that is achievable. As can be seen from the table below, the required oversampling factor is $2^N$, where N is the order of the DEM noise shaped function.

| Order of the DWA | DAC output level | Serial DAC frequency |
| --- | --- | --- |
| $1^{st}$ order | +1, −1 | $1*f_s$ |
| $2^{nd}$ order | +3, +1, −1, −3 | $3*f_s$ |
| $3^{rd}$ order | +7, +5, +3, +1, −1, −3, −5, −7 | $7*f_s$ |
| $4^{th}$ order | +15, +13, +11, +9, +7, +5, +3, +1, −1, −3, −5, −7, −9, −11, −13, −15 | $15*f_s$ |
| $N^{th}$ order | $+(2^N − 1), +(2^N − 3), \ldots, \ldots -(2^N − 1)$ | $(2^N − 1)*f_s$ |

It can be seen that for third order DEM's and higher, the oversampling factor for DAC of $7*f_s$ and higher can become difficult to implement. When the DAC reaches its limit in terms of frequency, one or more embodiments described herein can utilise further functionality to relax the frequency requirements.

Figure 13:
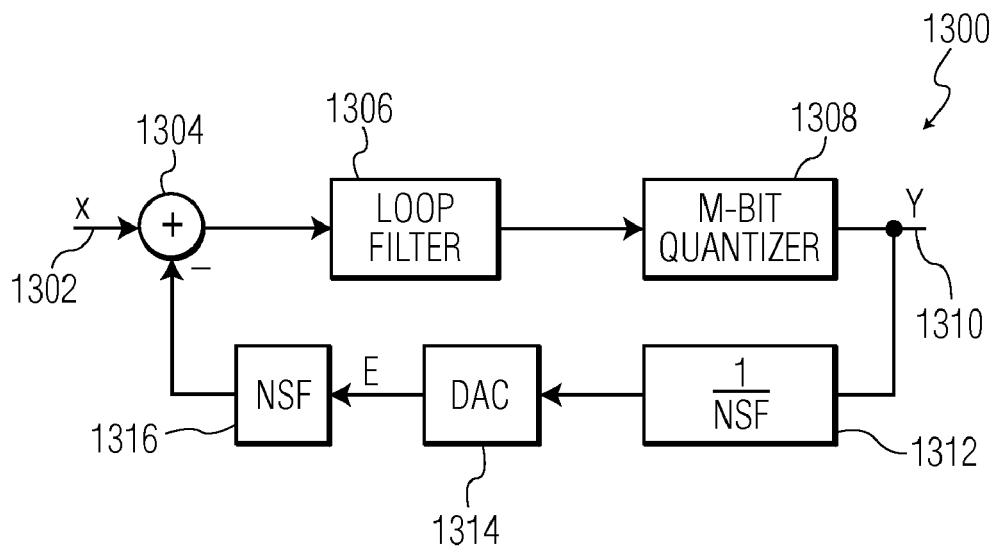
FIG. 13 shows a converter according to an embodiment of the invention.

An alternative way to implement a higher order DEM according to an embodiment of the invention is to provide a mixed signal implementation of the DEM noise shape function in the loop, which can be provided by the converter shown in FIG. 13.

FIG. 13 shows a converter according to an embodiment of the invention that receives a digital input signal x 1302 that is provided to a summation component 1304. The output of the summation component 1304 is provided to a loop filter 1306, and the output of the loop filter 1306 is provided to an M-bit quantizer 1308. The output of the M-bit quantizer is labelled signal Y 1310 in FIG. 13.

The output signal Y 1310 is fed back to an inverse noise shape function (1/NSF) component 1312, the output of which is provided to a digital to analogue converter (DAC) 1314. The output of the DAC 1314 comprises a DAC mismatch induced error E which is provided to an NSF component 1316. The output of the NSF component 1316 is provided as a negative input to the summation component 1304. In this example, an analogue high-pass filter 1312 is used as the noise shape function (NSF).

It will be appreciated from the description that follows that the converter of FIG. 13 provides an analogue implementation of an $N^{th}$ order DEM noise shape function, which is another way of reducing mismatch induced non-linearity. As will be described below, the converter of FIG. 13 can be extended to provide a mixed signal (digital and analogue) implementation of a noise shape function.

The converter of FIG. 13 can be represented mathematically by the following formula:

$$Y = X \cdot \frac{LF}{1+LF} + Q \cdot \frac{1}{1+LF} - E \cdot NSF \cdot \frac{LF}{1+LF}$$

Where Y is the output signal, X is the input signal, LF is the loop filter transfer function, E is the DAC induced error, and NSF is the noise shape function.

It can be seen that the DAC error E is multiplied by the noise shape function NSF.

In one or more embodiments of the invention, a standard sigma delta converter can be provided with the additional inverse NSF component 1312 before a DAC with DEM according to an embodiment of the invention, and the NSF component 1316 after the DAC in order to improve the performance of the converter.

Figure 14:
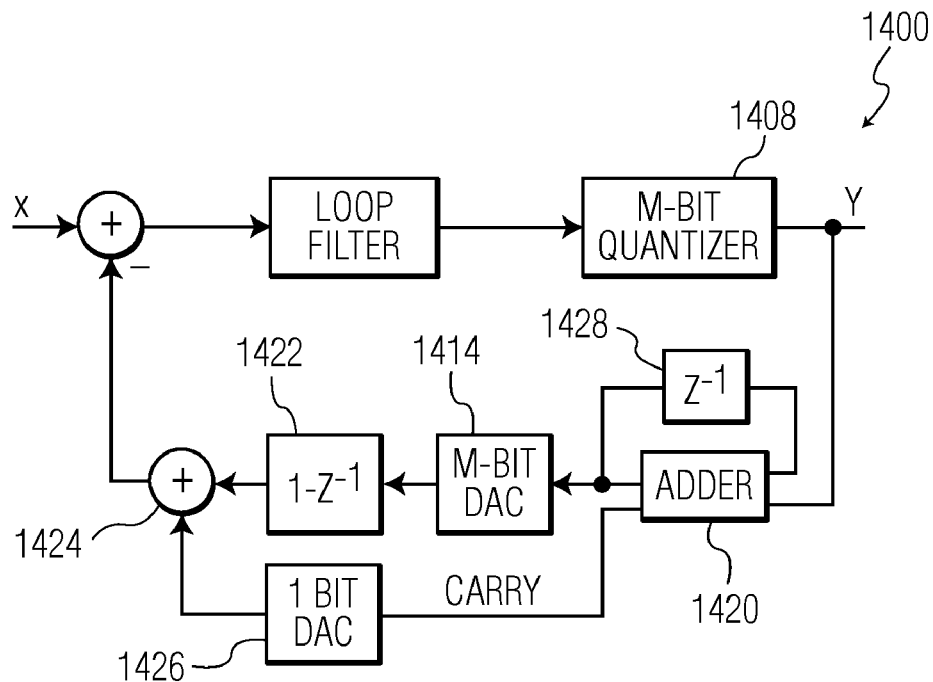
FIG. 14 shows a converter according to another embodiment of the invention.

FIG. 14 illustrates a converter 1400 according to an embodiment of the invention. In this example, the converter comprises a first order analogue low-pass DEM that applies a desired noise shaped function.

In the example of FIG. 14, the first order low-pass DEM, $1/(1-Z^{-1})$, is directly connected to the output of the M-bit quantizer 1408, which in this example is implemented in the digital domain in the form of an adder 1420. It will be appreciated that the adder 1420 is also an M-bit adder. The output of the adder 1420 is provided to the M-bit DAC 1414, and the output of the M-bit DAC 1414 will include an induced error E, as discussed above. The output of the M-bit DAC 1414 is provided to an analogue filter $(1-Z^{-1})$ 1422 such that the DAC induced error E will be noise shaped. The overflow/carry output of the adder 1420 is added to the output of the analogue filter 1422 by summation component 1424. Located between the carry output of the adder 1420 and the summation component 1424 is a one bit DAC 1426 to connect the analogue and digital domains.

A difference between analogue DEM and digital DEM is the implementation of the noise shape function in either the analogue or digital domains. The basic theory is the same. In the digital domain, $(1-Z^{-1})$ is interpreted as the pointer selection of an algorithm according to the invention disclosed herein, and the addition of the inverse of the delayed previous pointer selection with the present pointer selection that is performed by the adder 1420 and delay component 1428 relate to steps 2 and 3 of the algorithms described above. It will be appreciated that in the analogue domain, $(1-Z^{-1})$ can be perceived as an analogue filter.

Figure 15:
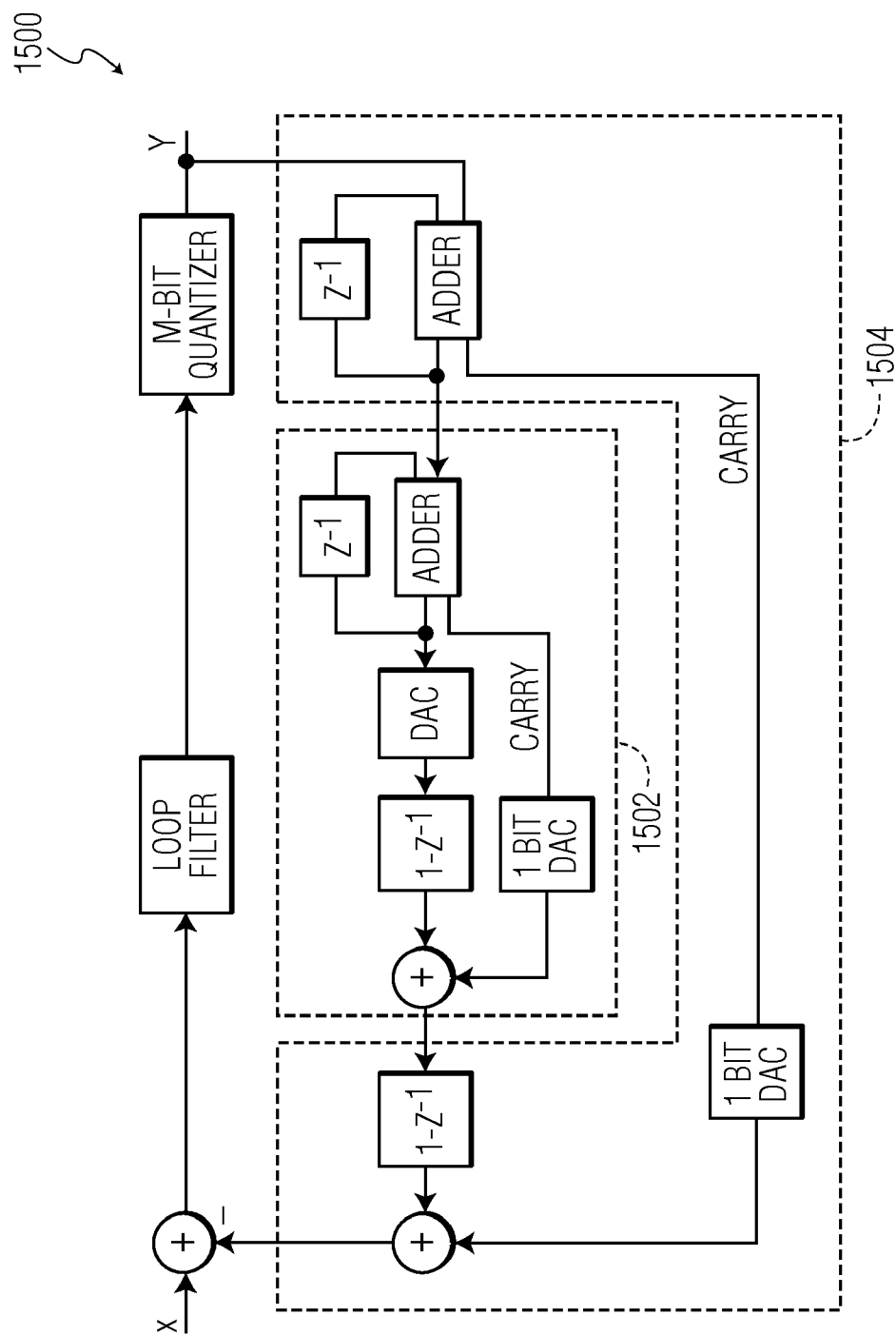
FIG. 15 illustrates a digital to analogue converter according to an embodiment of the invention.

FIG. 15 illustrates a digital to analogue converter 1500 according to an embodiment of the invention. In this example, the feedback loop of the converter 1500 is configured to apply an analogue second order low-pass DEM algorithm. The converter 1500 comprises two nested analogue first order functions 1502, 1504. That is, a first order noise shaped function is substituted into another first order noise shaped function. It will be appreciated that this structure corresponds to the functionality of increasing the order of the noise shaped function that was described in relation to the digital DEM algorithms as illustrated in FIG. 7.

As indicated above, the accuracy of the output level can be important for a digitally oversampled DAC implementation. For analogue implementation, the accuracy of the analogue high pass filter is also important. The requirement for accuracy may be such that known implementations are not feasible.

One or more embodiments of the invention can use the loop filter to provide an integrator that avoids the requirement for the analogue high pass filter $(1-Z^{-1})$ in the feedback loop. That is, the high pass filter can be embedded into the analogue loop filter design. A first stage loop filter can be used to cancel a first order NSF, and a second stage can be used to cancel a second order NSF. Generally speaking, as long as the loop filter order is higher than the NSF order, no actual NSF components need to be provided in the feedback loop. All of the analogue filters of the feedback loop can be cancelled by the loop filter stages.

For continuous sigma delta converters, the bilinear transformation between the analogue and digital domains $(1/x \sim 1/(1-Z^{-1}))$ is only valid for low frequency, which can cause problems for wideband systems. Indeed, for a continuous input signal, the integrator behaves as a continuous integrator (1/S). However, if the feedback signal is a discrete-time (switch-capacitor) signal (and not a continuous-time signal) the same integrator would behave as a discrete time integrator $(1/(1-Z^{-1}))$. Therefore, it will be appreciated that the analogue filter can be used as a noise shape function for both discrete time and continuous time systems. This enables noise shaping to be performed in the analogue domain as part of the loop filter.

In some embodiments, extending a digital implementation of the DEM beyond the third order by providing additional stages can increase the complexity of the processing performed by the feedback path. In order to address this, a converter according to an embodiment of the invention is shown in FIG. 16.

The converter 1600 uses both analogue and digital processing to provide the required $N^{th}$ order function. In this way, benefits can be obtained from both the digital and analogue implementations, such as the provision of a flexible and fully adjustable sigma delta modulator.

Figure 16:
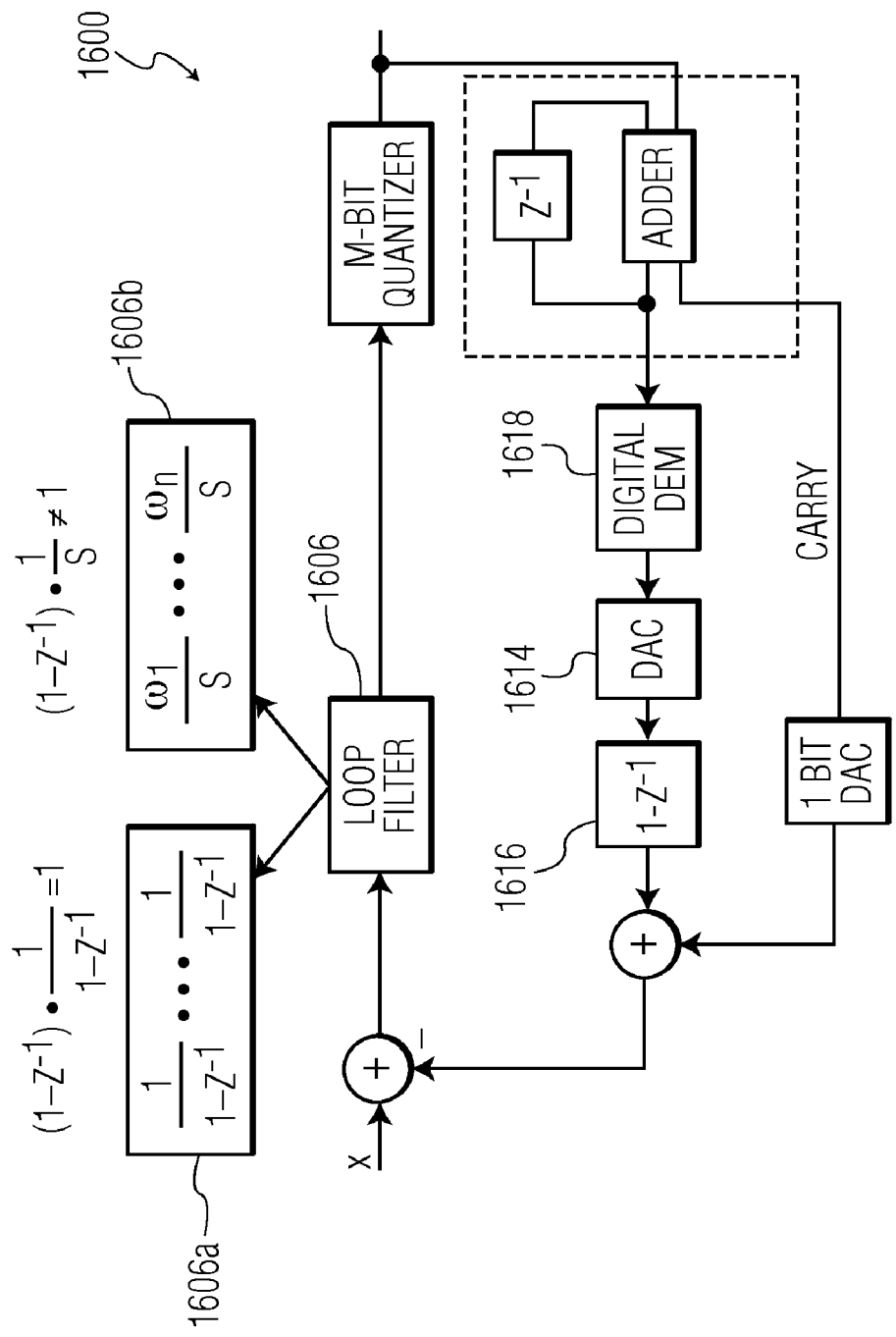
FIG. 16 shows a converter according to an embodiment of the invention.

The converter 1600 of FIG. 16 utilises a digital DEM component 1618 as described above in order to provide a first order function in the feedback path of the converter 1600, and therefore only requires two output levels of the digital to analogue converter 1614. The loop filter 1606 is also configured to provide an analogue first order noise shape function using the 1/NSF component 1612 and NSF component 1616 as described with reference to FIG. 13.

In this way, an overall second order noise function can be achieved through the combination of the analogue first order function and the digital first order function. This can reduce the complexity of the DAC implementation as a simple two-level DAC can be used. When compared with the second order analogue DEM, only a single analogue filter is required in the feedback loop, and this can be shifted to the loop filter relatively easily.

It will be appreciated that the structure of the converter shown in FIG. 16 can be extended by providing an additional one or more analogue filters to increase the order of the noise shape function and/or increasing the order of the digital DEM algorithm as discussed above.

Figure 17:
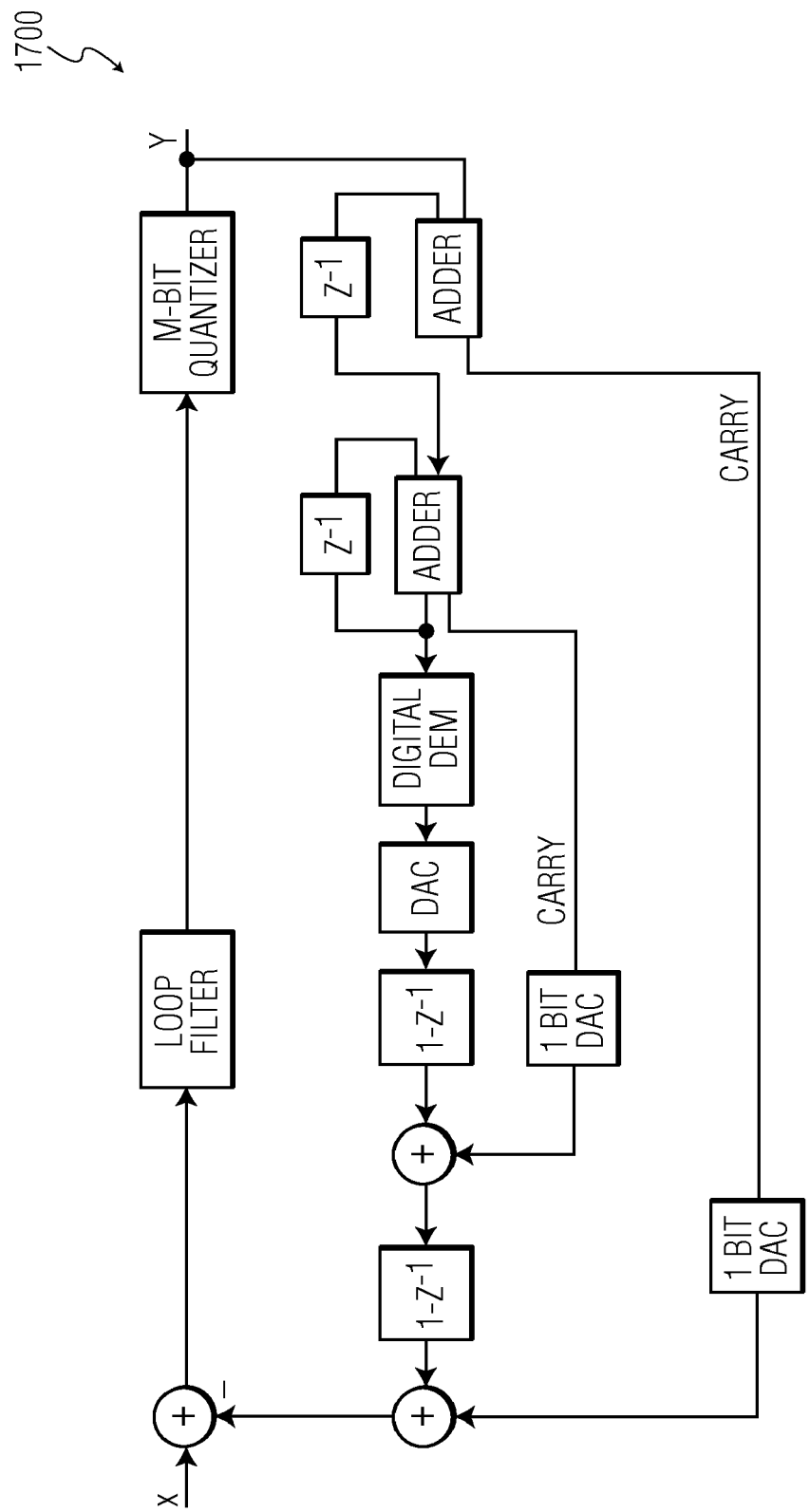
FIG. 17 shows a converter according to an embodiment of the invention.

As an example, a higher order converter 1700 is shown in FIG. 17, which includes a second order noise function in the feedback loop implemented in the analogue domain as well as digital DEM to provide any additional orders that are required.

It will be appreciated that an advantage associated with mixing an analogue and digital implementation of the noise shaped function is that the requirement to increase the sampling frequency in order to enable digital processing of an improved noise shaped function can be reduced by incorporating at least some of the functionality into the analogue loop filter.

Figure 18:
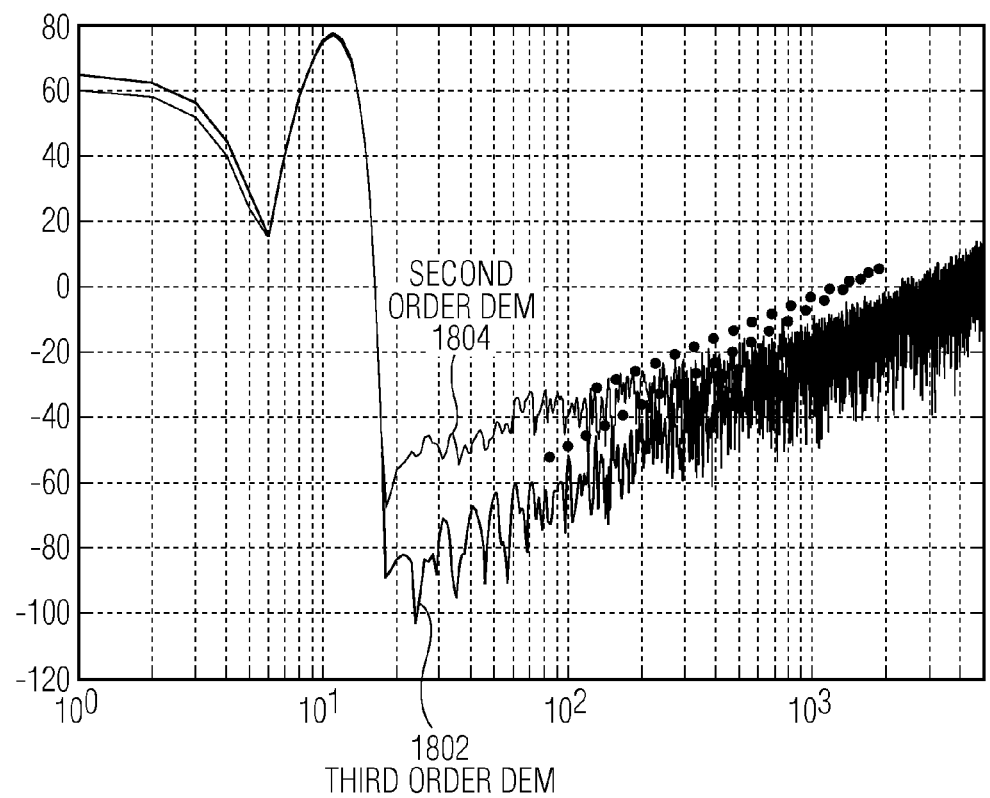
FIG. 18 illustrates graphically a comparison between the performance of converters.

FIG. 18 illustrates graphically a comparison between the performance of a mixed signal third order DEM 1802, whereby the third order DEM is provided by an analogue second order DEM and a digital first order DEM. Also shown in FIG. 18 is the result of a simulation of a second order DEM consisting of a digital first order DEM and an analogue first order DEM with reference 1804.

Figure 19:
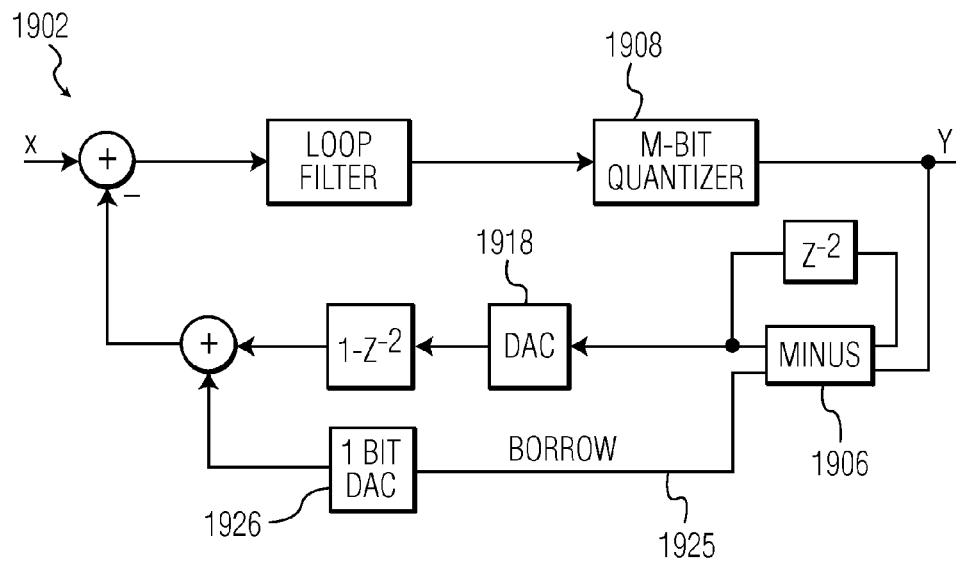
FIG. 19 illustrates converter according to an embodiment of the invention.

FIG. 19 illustrates a converter according to an embodiment of the invention, which is configured to implement a second order band stop noise function. For the second order band stop DEM, the noise shape function is $1+Z^{-2}$. Accordingly an analogue implementation 1902 of $$\frac{1}{1+Z^{-2}}$$

performance uses a minus function 1906 instead of an add function as shown in FIG. 14. Therefore, a borrow bit 1925 is used instead of a carry bit. Again, a one bit DAC 1926 is used to connect the digital borrow bit 1925 and analog feedback bit. For the same reason as in the low pass DEM situation of FIG. 14, a one-bit DAC is used to connect the analog and digital domain.

Figure 20:
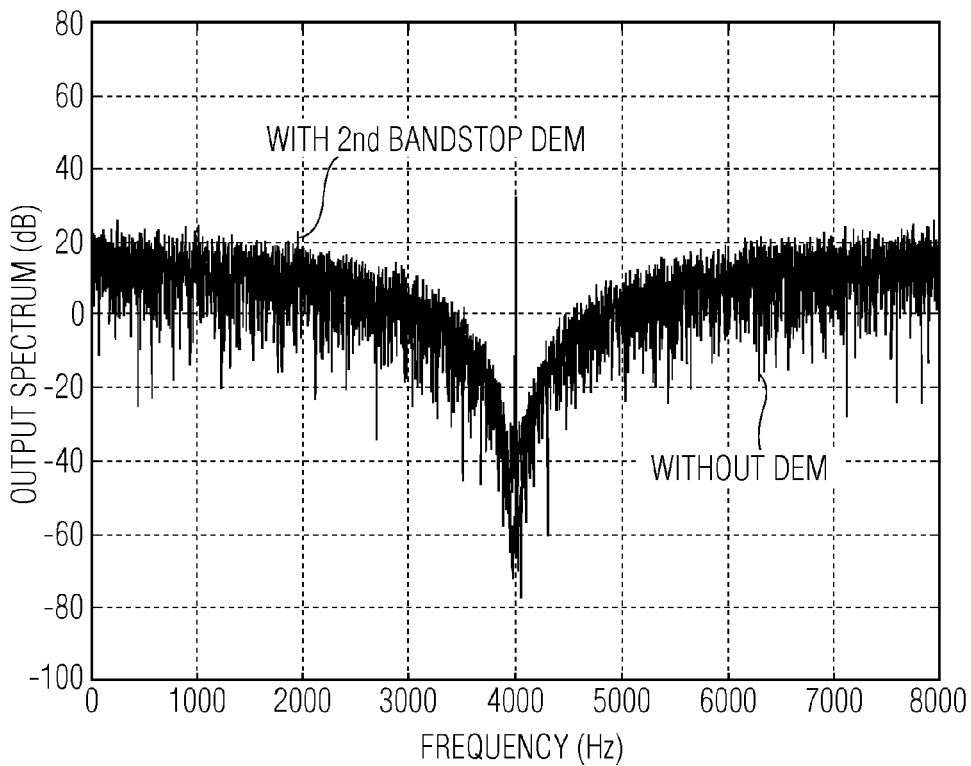
FIG. 20 illustrates the results of a simulation of the converter of FIG. 19.

The simulation result of the converter shown in FIG. 19 is shown as FIG. 20. It can be seen that the output spectrum with 1% mismatch without DEM, and the output spectrum for a converter with second order bandpass DEM are clearly distinguishable, and this can be representative of an improvement in the performance of a converter with second order bandpass DEM that is known from the prior art.

One or more embodiments disclosed herein can relate to:
An efficient implementation scheme of higher order data weighted averaging using an over sampled DAC to get accurate multi-level outputs, and this may be required for higher-order DEM/DWA algorithms;
Using an analog filter to increase the order of a DEM/DWA algorithm if the over sampling frequency is too high to implement an oversampled DAC;
Combined the above mentioned methods to implement third order, or even higher order, DEM/DWA noise shape functions to fulfill extremely high linearity requirements.

Embodiments of the invention can be used to provide sufficient shaping of mismatch induced distortion products to be able to process the entire bandwidth, and associated channels, in the FM frequency range (for example 88 MHz to 108 MHz), the entire bandwidth in an AM frequency band (27 MHz), and/or the entire bandwidth in a digital satellite radio range (25 MHz). Also, embodiments of the invention can be used to process signals at base stations that may have a bandwidth of 40-80 MHz.

Further still applications of embodiments of the invention can include wideband sigma-delta converters that are used in medical or industrial situations, such as for providing ultrasound applications. Embodiments of the invention can be used for any multi-bit sigma-delta modulator for highly linear applications, including audio codecs.

The invention claimed is:

1. A method of providing a value for each element of a sequence of elements in a multi-bit data converter, the values being for a present conversion cycle in operation of the converter, wherein a pointer position identifies an element in the sequence of elements for a conversion cycle, the method comprising:
calculating a pointer position for the present conversion cycle ($P_{i+1}$) in accordance with an $N^{th}$ order noise shaped function based on pointer positions for N previous conversion cycles ($P_i$ to $P_{i-(N-1)}$);
determining if the pointer position for the present conversion cycle ($P_{i+1}$) is in excess of the number of elements in the sequence;
attributing a first component-value to all of the elements, comprising:
attributing a first component-value of +1 if the pointer position for the present conversion cycle ($P_{i+1}$) is in excess of the number of elements in the sequence; and
attributing a first component-value of −1 if the pointer position for the present conversion cycle ($P_{i+1}$) is not in excess of the number of elements in the sequence;
updating the new pointer position ($P_{i+1}$) by performing a modulo operation and replacing the new pointer position ($P_{i+1}$) with the remainder value;
attributing a second component-value to the elements in accordance with a $(N-1)^{th}$ order algorithm;
attributing a third component-value to the elements in accordance with the inverse of the second component-value for the previous conversion cycle; and
adding the first, second and third component-values for each element in order to provide a value for each of the elements for the present conversion cycle.

2. The method of claim 1, wherein the $N^{th}$ order noise shaped function is a first order function, and:
calculating the new pointer position ($P_{i+1}$) comprises adding an index to the previous pointer position ($P_i$); and
attributing the second component-value to the elements comprises:
attributing a value of −1 for all elements at a position less than, or equal to, the new pointer position ($P_{i+1}$); and
attributing a value of +1 for all elements at a position greater than the new pointer position ($P_{i+1}$).

3. The method of claim 1, wherein the $N^{th}$ order noise shaped function is a second order function, and:
calculating the new pointer position (Pi+1) comprises multiplying the present pointer position (Pi) by two, adding an index and subtracting the previous pointer position ($P_{i-1}$); and
attributing the second component-value to the elements comprises:
attributing a value of +1 for all elements at a position between the present pointer position ($P_i$) and the new pointer position ($P_{i+1}$), and attributing a value of −1 for all other elements; and attributing the third component-value to the elements comprises:

attributing a value of −1 for all elements at a position between the previous pointer position ($P_{i−1}$) and the present pointer position ($P_i$), and attributing a value of +1 for all other elements.

4. The method of claim 1, further comprising, prior to calculating the pointer position for the present conversion cycle:

updating the N previous pointer positions to remove any overflow between successive pointer positions; and after attributing the first component-values:

performing a modulo operation and replacing the N previous pointer positions with the remainder value.

5. The method of claim 1, wherein determining if the pointer position for the present conversion cycle ($P_{i+1}$) is in excess of the number of elements in the sequence comprises identifying whether or not the pointer position will rollover the sequence of elements.

6. The method of claim 1, wherein the step of adding the first, second and third component-values for each element can result in a plurality of different values, the method further comprising:

providing the value for each of the elements for the present conversion cycle by providing a temporal sequence of sub-values to an element for the conversion cycle, wherein the sequence of sub-values is symmetrical.

7. The method of claim 1, wherein determining if the pointer position for the present conversion cycle ($P_{i+1}$) is in excess of the number of elements in the sequence comprises determining if the difference between the pointer position for the present conversion cycle ($P_{i+1}$) and the pointer position for the previous conversion cycle ($P_i$) is in excess of the number of elements in the sequence.

8. The method of claim 1, comprising a method of dynamic element matching/digital weight averaging.

9. The method of claim 1, wherein the elements are digital-to-analogue units.

10. The method of claim 9, wherein the elements are configured to provide one of a plurality of discrete values therefrom.

11. A converter configured to implement the method of claim 1.

12. The converter of claim 11, wherein the converter is a switched-capacitor digital to analogue converter.

13. A sigma-delta converter comprising:

both a digital implementation and an analogue implementation of a digital to analogue converter according to claim 11 in the feedback loop of the sigma-delta converter.

14. An integrated circuit comprising the converter of claim 11.

15. A computer program, which when run on a computer, causes the computer to configure the integrated circuit of claim 14.

16. A computer program, which when run on a computer, causes the computer to configure the converter of claim 11.

17. A computer program, which when run on a computer, causes the computer to perform the method of claim 1.

* * * * *